United States Patent
Jain et al.

(10) Patent No.: US 11,121,097 B1
(45) Date of Patent: Sep. 14, 2021

(54) ACTIVE X-RAY ATTACK PREVENTION DEVICE

(71) Applicant: GLOBALFOUNDRIES U.S. INC., Santa Clara, CA (US)

(72) Inventors: Vibhor Jain, Williston, VT (US); Sebastian T. Ventrone, South Burlington, VT (US); Siva P. Adusumilli, South Burlington, VT (US); John J. Ellis-Monaghan, Grand Isle, VT (US); Ajay Raman, Essex Junction, VT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/881,736

(22) Filed: May 22, 2020

(51) Int. Cl.
*H01L 23/00* (2006.01)
*H01L 23/48* (2006.01)

(52) U.S. Cl.
CPC .......... *H01L 23/576* (2013.01); *H01L 23/481* (2013.01)

(58) Field of Classification Search
CPC ............................. H01L 23/576; H01L 23/481
See application file for complete search history.

(56) References Cited

U.S. PATENT DOCUMENTS

| | | | |
|---|---|---|---|
| 7,295,455 B2 | 11/2007 | Okuda | |
| 8,110,894 B2 | 2/2012 | Savry et al. | |
| 8,198,641 B2 | 6/2012 | Zachariasse | |
| 8,742,830 B2 | 6/2014 | Luo et al. | |
| 8,809,858 B2 | 8/2014 | Lisart et al. | |
| 8,946,859 B2 | 2/2015 | Lisart et al. | |
| 9,117,833 B2 | 8/2015 | Mougin et al. | |
| 9,306,573 B2 | 4/2016 | McCollum | |
| 9,741,670 B2* | 8/2017 | Charbonnier | H01L 23/573 |
| 9,953,727 B1 | 4/2018 | Fifield et al. | |
| 9,965,652 B2 | 5/2018 | Joharapurkar et al. | |
| 2010/0059822 A1* | 3/2010 | Pinguet | H04B 10/2575 257/351 |
| 2011/0193221 A1* | 8/2011 | Hu | H01L 23/49816 257/737 |
| 2015/0214163 A1* | 7/2015 | Kuenemund | H01L 23/57 324/76.11 |
| 2018/0075921 A1 | 3/2018 | Fifield et al. | |

(Continued)

OTHER PUBLICATIONS

Specification and Figures for related U.S. Appl. No. 16/855,185, filed Apr. 22, 2020.

(Continued)

*Primary Examiner* — Seokjin Kim
(74) *Attorney, Agent, or Firm* — Francois Pagette; Andrew M. Calderon; Roberts Calderon Safran & Cole, P.C.

(57) ABSTRACT

The present disclosure relates to a metal layer for an active x-ray attack prevention device for securing integrated circuits. In particular, the present disclosure relates to a structure including a semiconductor material, one or more devices on a front side of the semiconductor material, a backside patterned metal layer under the one or more devices, located and structured to protect the one or more devices from an active intrusion, and at least one contact providing an electrical connection through the semiconductor material to a front side of the backside patterned metal layer. The backside patterned metal layer is between a wafer and one of the semiconductor material and an insulator layer.

19 Claims, 5 Drawing Sheets

(56) References Cited

U.S. PATENT DOCUMENTS

| | | |
|---|---|---|
| 2019/0027535 A1* | 1/2019 | Kumar .................. H01L 27/228 |
| 2020/0076622 A1* | 3/2020 | Best ...................... H04L 9/0866 |
| 2020/0251602 A1 | 8/2020 | Shen et al. |
| 2020/0328162 A1* | 10/2020 | Haba ..................... H01L 23/573 |

OTHER PUBLICATIONS

Specification and Figures for related U.S. Appl. No. 16/568,394, filed Sep. 12, 2019.
Boyer et al.,"Evaluation of the Near-Field Injection Method at Integrated Circuit Level", Freescale Semiconductor, Inc., Toulouse 31023, France, Sep. 2014, 8 pages.
Manich et al.,"Detection of Probing Attempts in Secure ICs", 2012 IEEE International Symposium on Hardware-Driented Security and Trust, 6 pages.
Shen et al., "Nanopyramid: An optical scrambler against backside probing attacks", Florida Institute for Cyber Security (FIGS), Published Online: Nov. 1, 2018, 10 pages.
Specification and Figures for U.S. Appl. No. 17/070,377, filed Oct. 14, 2020.

* cited by examiner

ACTIVE X-RAY ATTACK PREVENTION DEVICE

FIELD OF THE INVENTION

The present disclosure relates to integrated circuits, and more particularly, to an active x-ray attack prevention device for securing integrated circuits and methods of operation.

BACKGROUND

When using active x-ray spectrum analysis, a party can observe an integrated circuit under power and a voltage contrast and determine a functional state of the design. Further, it is possible to unlock a private key of devices once a decrypting step of the private key has occurred and the register of the integrated circuit is first used. A known technique to prevent such unlocking can encompass package shielding, but this is still prone to tampering. Accordingly, known techniques have not been able to prevent uncovering of key technology and intellectual property in an integrated circuit.

SUMMARY

In an aspect of the disclosure, a structure includes a semiconductor material, one or more devices on a front side of the semiconductor material, a backside patterned metal layer under the one or more devices, located and structured to protect the one or more devices from an active intrusion, and at least one contact providing an electrical connection through the semiconductor material to a front side of the backside patterned metal layer. The backside patterned metal layer is between a wafer and one of the semiconductor material and the insulator layer.

In another aspect of the disclosure, a structure includes a semiconductor material, at least one device on a front side of the semiconductor material, a backside patterned metal layer buried on a backside of the semiconductor material, at least one contact connecting to a front side of the backside patterned metal layer, the at least one contact extending through the semiconductor material, and a logic circuit connecting to the backside patterned metal layer via the at least one contact, and which is configured to detect a resistance change in the backside patterned metal layer.

In another aspect of the disclosure, a method includes forming an insulator layer, forming a semiconductor layer on the insulator layer, forming a back end of the line (BEOL) layer on the semiconductor layer, forming a backside patterned metal layer on a backside of the insulator layer, and forming a handle wafer on the backside patterned metal layer.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to integrated circuits, and more particularly, to an active x-ray attack prevention device for securing integrated circuits and methods of operation. More specifically, the present disclosure provides a buried patterned metal layer to prevent chip hacking utilizing a backside attack from a scanning electron microscope (SEM). By implementing the devices disclosed herein, circuits can detect a resistance change in the buried patterned metal layer and generate a tamper signal to alter circuit operation when there is a backside attack from a scanning electron microscope (SEM). Accordingly and advantageously, by implementing the devices disclosed herein, the devices can prevent an active x-ray attack from determining a functional state of a circuit design and prevent the theft of key technology and intellectual property.

In known circuits, an attack and/or analysis can occur on a circuit from scanning a backside of a chip across a die. The attack and/or analysis can capture the function of the device which can then be re-constructed. For example, the analysis can be done through active and passive optical probing using photo emission (PE), electro-optical frequency modulation, or laser voltage techniques. To avoid the attack and/or analysis on a circuit, a charge trap logic structure can be used; however, in this type of circuit, the attack and/or analysis can occur after the charge trap device has been bypassed. Further, package shielding can prevent the attack and/or analysis on a circuit; however, the package shielding is susceptible to tampering. In contrast, the present disclosure provides a buried metal layer which is used to generate a tamper signal to alter circuit operation when there is a backside attack from the SEM. In particular, the present disclosure includes a buried metal layer which prevents x-rays from passing through to a functional circuit.

In embodiments of the present disclosure, an integrated circuit includes active and passive devices formed on front side of a wafer. Further, a patterned metal is buried between a buried oxide layer (BOX) and a wafer. A contact in the integrated circuit provides an electrical connection from the patterned metal to the front side of the wafer. Further, the integrated circuit includes a logic circuit which detects a resistance change in the patterned metal and generates a tamper signal to alter a circuit operation. Advantageously, the present disclosure prevents x-rays from penetrating to the chip, while using body contacts to the buried patterned metal or the backside patterned metal. The integrated circuit detects any changes to resistance of the buried patterned metal or the backside patterned metal which indicates tampering to remove the buried metal.

The devices of the present disclosure can be manufactured in a number of ways using a number of different tools. In general, though, the methodologies and tools are used to form structures with dimensions in the micrometer and nanometer scale. The methodologies, i.e., technologies, employed to manufacture the devices of the present disclosure have been adopted from integrated circuit (IC) technology. For example, the structures are built on wafers and are realized in films of material patterned by photolithographic processes on the top of a wafer. In particular, the fabrication of the devices uses three basic building blocks: (i) deposition of thin films of material on a substrate, (ii) applying a patterned mask on top of the films by photolithographic imaging, and (iii) etching the films selectively to the mask.

Figure 1:
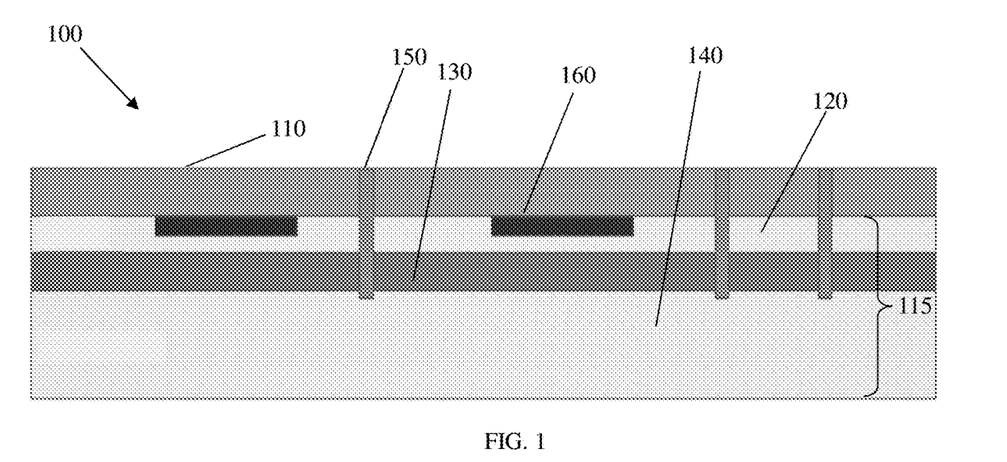
FIG. 1 show body contacts, amongst other features and respective fabrication processes, in accordance with aspects of the present disclosure.

FIG. 1 shows body contacts, amongst other features, and respective fabrication processes. The structure 100 of FIG. 1 can be representative of semiconductor on insulator (SOI) technologies. More specifically, in FIG. 1, the structure 100 includes a substrate 115 comprising silicon on insulator (SOI) technology. In the SOI technology, the substrate 115 includes a semiconductor material 120 bonded or attached to an insulating layer 130, and the insulating layer 130 is bonded to a handle wafer 140. The semiconductor material 120 can be bonded to the insulating layer 130 by using wafer bonding techniques and/or other suitable methods. In embodiments, the handle wafer 140 and semiconductor material 120 may be composed of any suitable material including, but not limited to, Si, SiGe, SiGeC, GaAs, InAs, InP, and other III/V or II/VI compound semiconductors. The insulating layer 130 is also formed by any suitable process, such as separation by implantation of oxygen (SIMOX), oxidation, deposition, and/or other suitable process. The insulator layer 130 comprises any suitable material, including silicon oxide, sapphire, or other suitable insulating materials, and/or combinations thereof. An exemplary insulator layer 130 may be a buried oxide layer (BOX). In embodiments, the semiconductor material 120 and the insulator layer 130 has a depth of about 100 nanometers; however, other dimensions are also contemplated herein.

Still referring to FIG. 1, devices 160 are formed within or on the semiconductor material 120. The devices 160 can be either active or passive devices. For example, the devices 160 can be transistors, resistors, capacitors, combinations thereof, etc. A back end of the line (BEOL) layer 110 is deposited on the semiconductor material 120 by conventional deposition processes, e.g., chemical vapor deposition (CVD) processes. In embodiments, the BEOL layer 110 is an entire back end stack, which comprises a stack of metals and vias for wiring including inductors, resistors, and capacitors.

FIG. 1 further shows a plurality of contacts 150 formed by conventional lithography, etching and deposition methods known to those of skill in the art. For example, a resist formed over the BEOL layer 110 is exposed to energy (light) to form a pattern (opening). An etching process with a selective chemistry, e.g., reactive ion etching (RIE), will be used to form one or more trenches in the BEOL layer 110, the semiconductor material 120, and the insulating layer 130 through the openings of the resist, extending into the handle wafer 140. In another embodiment, an etching process with a selective chemistry, e.g. reactive ion etching (RIE), will be used to form one or more trenches in a front end of the line (FEOL) through the semiconductor material 120 and the insulating layer 130 through the openings of the resist, extending into the handle wafer 140. Following the resist removal by a conventional oxygen ashing process or other known stripants, metal material can be deposited within the trenches to form a plurality of contacts 150, e.g., body contacts. In embodiments, the metal material can be aluminum or tungsten (e.g., WSi) or Copper, amongst other materials, deposited by any conventional deposition processes, e.g., CVD processes. Any residual material on the surface of the BEOL layer 110 can be removed by conventional chemical mechanical polishing (CMP) processes.

Figure 2:
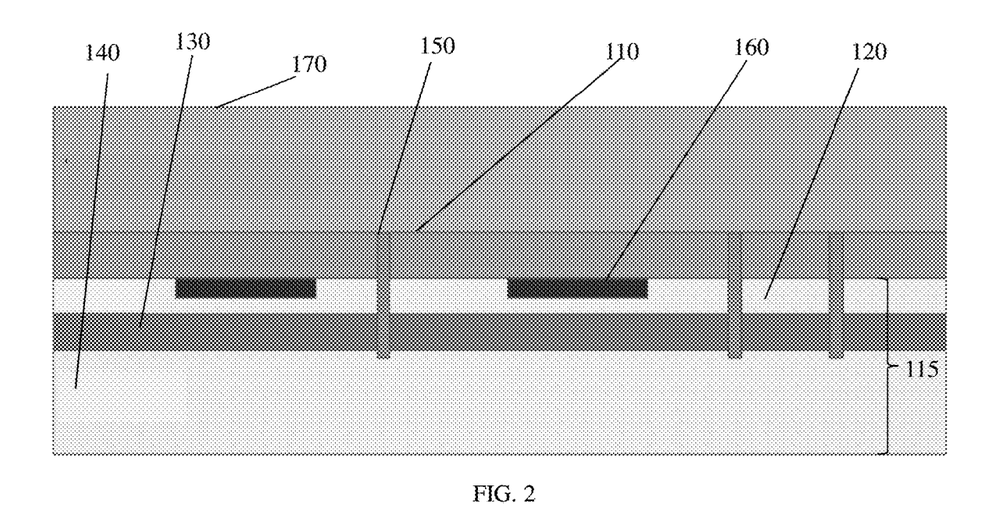
FIG. 2 shows a handle wafer, amongst other features and respective fabrication processes, in accordance with aspects of the present disclosure.

In FIG. 2, a temporary handle wafer 170 is attached to the BEOL layer 110 by conventional bonding processes. For example, the temporary handle wafer 170 can be bonded to the BEOL layer 110 by contact bonding or thermo-impression bonding. Contact bonding uses a liquid-like curable adhesive layer that is coated onto a carrier wafer, as thermo compression process comprises heating and applying thermal and mechanical pressure to two joining bodies.

Figure 3:
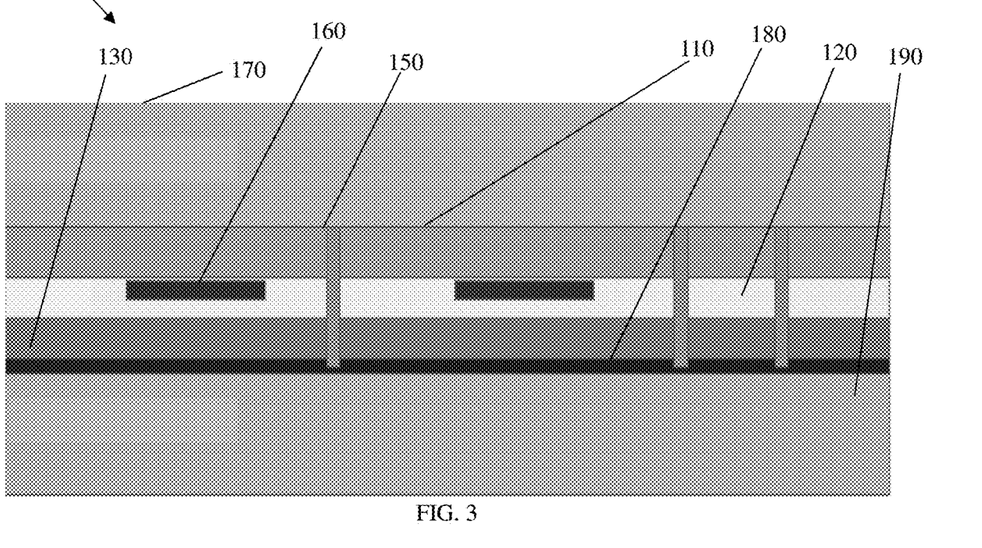
FIG. 3 shows a backside patterned metal layer, amongst other features and respective fabrication processes, in accordance with aspects of the present disclosure.

In FIG. 3, the structure of FIG. 2 is flipped over, e.g., upside down, and the handle wafer 140 is removed by conventional processes including mechanical polishing, debonding or other known process. The removal of the handle wafer 140 will expose the insulator layer 130 (i.e., BOX layer) and the body contacts 150. A backside patterned metal layer 180 (i.e., buried patterned metal layer 180) is formed on the exposed backside of the insulator layer 130 (i.e., BOX layer) and in contact with the body contacts 150. In particular, the pattern of the backside patterned metal layer 180 has dimensions that prevents a SEM to detect devices over the pattern.

In embodiments, the metal material of the backside patterned metal layer 180 can be deposited by conventional deposition methods, followed by a patterning process, e.g., lithography and etching, to form different patterns. A handle wafer 190 is attached or deposited over the backside patterned metal layer 180 by conventional techniques, as described herein and which are known to those of skill in the art such that no further explanation is required.

Figure 4:
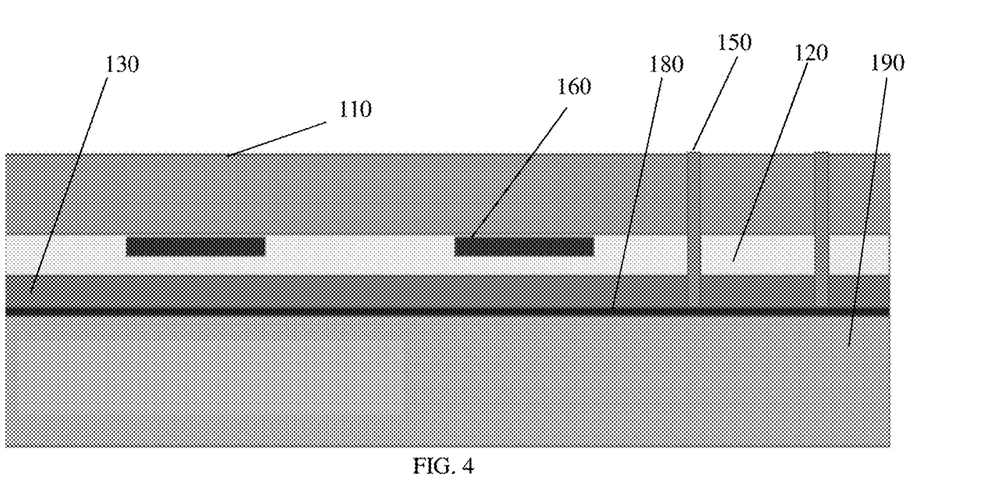
FIG. 4 shows a removal of a handle wafer, amongst other features and respective fabrication processes, in accordance with aspects of the present disclosure.

In FIG. 4, the temporary handle wafer 170 is removed by conventional debonding techniques. For example, debonding can be provided by mechanical forces, e.g., cleavage, amongst other debonding techniques known to those of ordinary skill in the art such that no further explanation is required for a complete understanding of the disclosure.

By implementing the processes described herein, a backside patterned metal layer 180 is provided between the insulator layer 130 (i.e., the BOX layer 130) and the handle wafer 190. The integrated circuit 100 in FIG. 4 does not need a through-silicon via (TSV). Further, in FIG. 4, the buried pattern metallization (i.e., the backside patterned metal layer 180) with body contacts 150 can be connected to a logic circuit (which can be represented by any of the devices 160). The logic circuit 160 can be utilized to detect any tampering of the backside patterned metal layer 180. For example, any attempts to remove the handle wafer 190 and the backside patterned metal layer 180 will result in a higher resistance measured by the logic circuit, which will trigger a tamper signal. The logic circuit 160 for detecting resistance changes can be any known circuit design.

Figure 5:
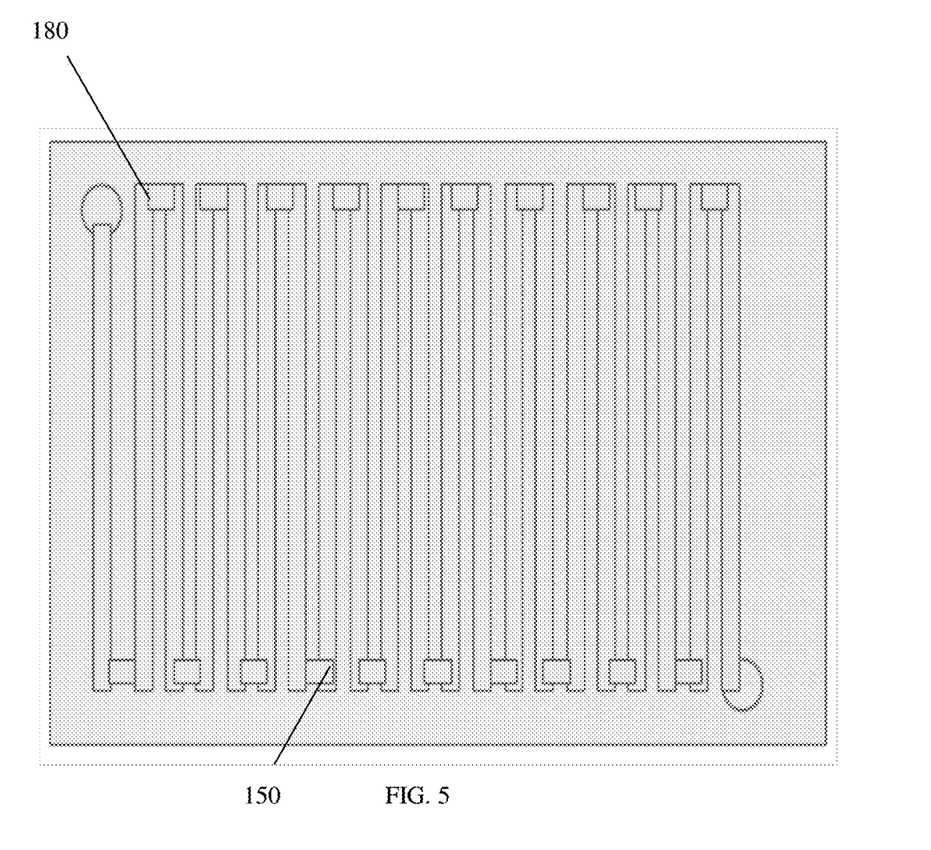
FIG. 5 shows a representative diagram of a backside metal patterning, in accordance with aspects of the present disclosure.

FIG. 5 shows a representative diagram of a backside metal patterning. In FIG. 5, the backside metal patterning 180 includes body contacts 150 placed at different distances and locations of the backside metal patterning 180 to measure resistance of the backside patterned metal layer 180. In the pattern of FIG. 5, the backside patterned metal layer 180 is in a serpentine pattern; although other patterns are contemplated herein. The pattern should be preferably be such that the devices and, hence, their functionality, are shielded from attack. For example, the pattern can be concentric shapes (e.g., circles, rectangles, octagon etc.), spiral configurations of different shapes (e.g., circles, rectangles, octagon etc.), with a pitch or space between adjacent lines being sized to prevent backside monitoring. In this way, the backside patterned metal layer 180 will prevent X-rays from penetrating the back of the handle wafer 190, with any tampering of the patterning changing the resistance of the backside patterned metal layer 180. The resistance change will be an alert to tampering, at which time the device(s) can be deactivated.

In further embodiments, a serpentine shape can have multiple sense taps (e.g., body contacts 150) along a length of the serpentine structure. In this way, an external resistor cannot be used to bypass the integrated circuit (i.e., the integrated circuit 100). Further, a series of these serpentine (or other shaped) patterned metal structures can be added to a chip to prevent localized attacks. In yet further embodiments, to compensate for resistance changes as a function of temperature (i.e., versus a hacking attempt), several resistors can be used for comparison. For example, if all resistances of the resistors increase (within a known tolerance), that that is most likely due to thermal changes and not a hacking/tampering attempt. However, if at least one of the resistors increases outside of a known tolerance while other resistors stay stable or only increase within the known tolerance, then that is most likely due to a hacking/tampering attempt, and not due to thermal changes.

Figure 6:
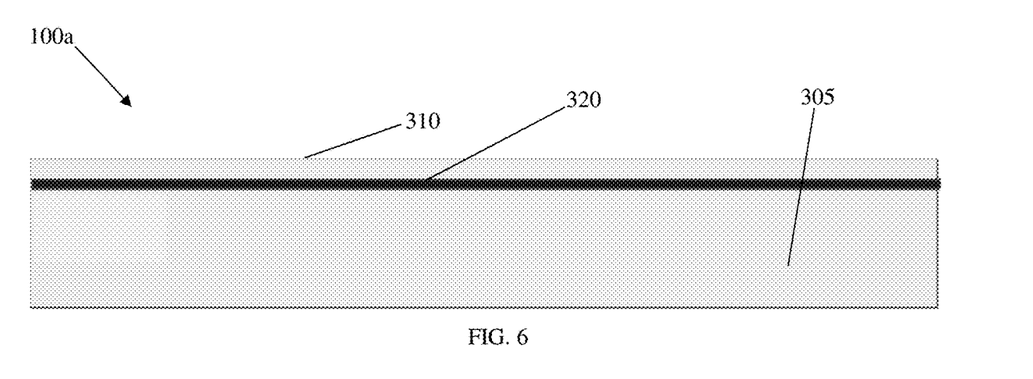
FIG. 6 shows a bulk silicon wafer with a silicon germanium (SiGe) stack, amongst other features and respective fabrication processes, in accordance with aspects of the present disclosure.

FIGS. 6-9 show a through-silicon via (TSV) method with a backside metal, in accordance with aspects of the present disclosure. In FIG. 6, the structure 100a includes a bulk silicon wafer 305 with a silicon germanium (SiGe) stack 320 grown on the bulk silicon wafer 305. In particular, the SiGe material 320 can be 10-20% Ge and 80-90% Si. The SiGe material 320 can be 100 nanometers or thicker to act as a marker layer, e.g., etch stop and the bulk wafer 310 can be about 100 microns; although other dimensions are also contemplated herein. In embodiments, semiconductor material 310 is deposited, e.g., grown, on the SiGe material 320. In embodiments, the semiconductor material 310 can be single crystalline Si material; although other semiconductor materials as noted herein are also contemplated. In further embodiments, the SiGe stack 320 can be excluded, with an etch being performed based on a final wafer thickness.

Figure 7:
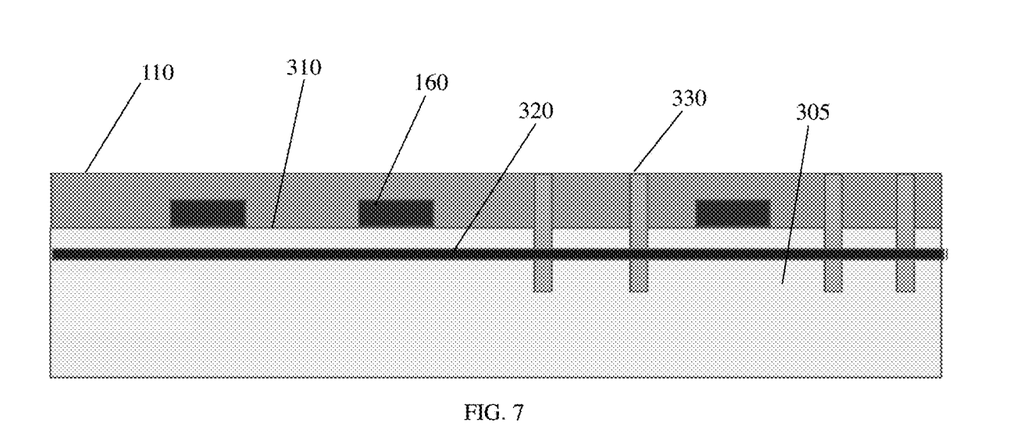
FIG. 7 shows a back end of the line (BEOL) layer, amongst other features and respective fabrication processes, in accordance with aspects of the present disclosure.

In FIG. 7, a back end of the line (BEOL) layer 110 is deposited on the semiconductor material 310 by conventional deposition processes, e.g., CVD processes. In embodiments, the BEOL layer 110 is an entire back end stack, which comprises a stack of metals and vias for wiring including inductors, resistors, and capacitors. Further, devices 160 are formed on the semiconductor material 310, surrounded by the BEOL layer 110. The devices 160 can be either active or passive devices as described herein.

FIG. 7 further shows a plurality of through-silicon via (TSV) contacts 330 formed by conventional, lithography, etching and deposition methods known to those of skill in the art such that no further explanation is required for an understanding of the present disclosure. The TSV contacts 330 can extend through the BEOL layer 110, semiconductor material 310, SiGe material 320, and into the wafer 305. By way of example, the TSVs 330 can have a depth of about 100 microns; however, other dimensions are also contemplated herein.

Figure 8:
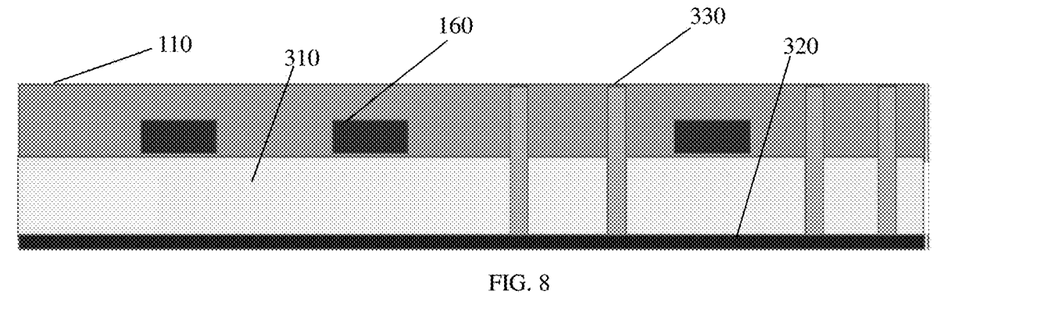
FIG. 8 shows a thinned wafer, amongst other features and respective fabrication processes, in accordance with aspects of the present disclosure.
Figure 9:
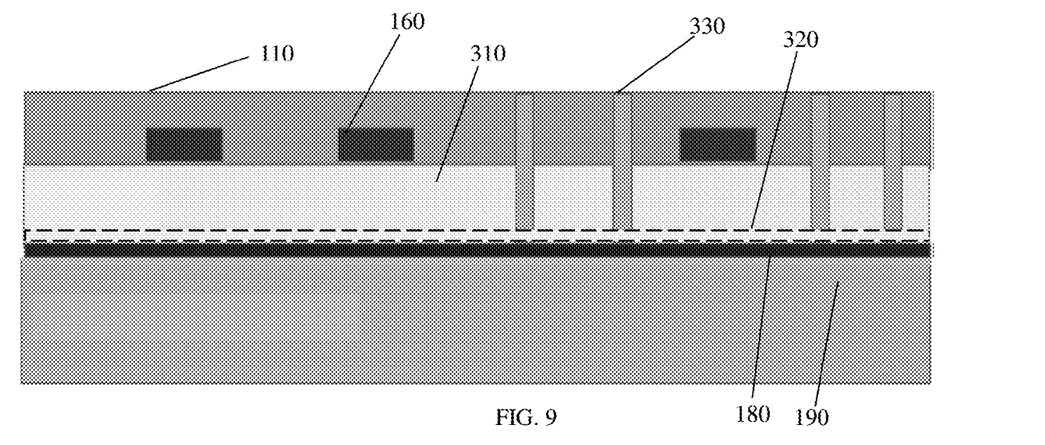
FIG. 9 shows a backside patterned metal layer on a backside of a semiconductor material, amongst other features and respective fabrication processes, in accordance with aspects of the present disclosure.

In FIG. 8, the wafer 305 is thinned to a depth of the SiGe material 320. Due to the material selectivity between the wafer 305 and SiGe material 320, the SiGe material 320 can be used as an etch stop layer. In FIG. 9, after the SiGe material 320 is removed, exposing the TSVs 330, a backside patterned metal layer 180 (and wafer 190) is formed on a backside of the semiconductor material 310, with backside patterned metal layer 180 in electrical contact with the TSV contacts 330.

In alternative embodiments, the SiGe material 320 can remain on the semiconductor material 310 as shown representatively in FIG. 9 by the dashed line. In this embodiment, the backside patterned metal layer 180 (i.e., buried patterned metal layer 180) is formed on the backside of the SiGe material 320, in electrical contact with the TSV contacts 330. In any of the embodiments and as previously noted, metallization on the backside of the wafer will prevent scanning electron microscope/transmission electron microscope (SEM/TEM) electrons from reaching the device 160.

A metal layer for an active x-ray attack prevention device can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as Smartphones) and edge computing markets. SoC is also commonly used in embedded systems and the Internet of Things.

The structures and methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A structure, comprising:
    a semiconductor material;
    one or more devices on a front side of the semiconductor material;

a backside patterned metal layer under the one or more devices, located and structured to protect the one or more devices from an active intrusion;

at least one contact providing an electrical connection which extends through the semiconductor material and an insulator layer to a front side of the backside patterned metal layer; and a logic circuit connected to the backside patterned metal layer configured to detect a resistance change in the backside patterned metal layer, wherein the backside patterned metal layer is between a wafer and the insulator layer, and is separated from the one or more devices and the semiconductor material by the insulator layer.

2. The structure of claim 1, wherein:
the insulator layer is under the semiconductor material,
the wafer is under the insulator layer, and
the backside patterned metal layer is between the insulator layer and the wafer.

3. The structure of claim 1, wherein the logic circuit is configured to generate a tamper signal to alter a circuit operation in response to the detected resistance change.

4. The structure of claim 1, wherein the logic circuit detects when at least one of the contacts has the resistance change above the threshold resistance while other contacts have the resistance change below the threshold resistance.

5. The structure of claim 1, wherein the logic circuit is configured to indicate that thermal change has occurred.

6. The structure of claim 1, wherein the at least one contact comprises a plurality of contacts along the backside patterned metal layer and further comprising a silicon germanium (SiGe) material which directly contacts a top surface of the backside patterned metal layer and directly contacts a bottom surface of the semiconductor material.

7. A structure, comprising:
a semiconductor material;
one or more devices on a front side of the semiconductor material;
a backside patterned metal layer under the one or more devices, located and structured to protect the one or more devices from an active intrusion; and
at least one contact providing an electrical connection which extends through the semiconductor material and an insulator layer to a front side of the backside patterned metal layer,
wherein the backside patterned metal layer is between a wafer and the insulator layer, and is separated from the one or more devices and the semiconductor material by the insulator layer, and
the backside patterned metal layer is a serpentine shape.

8. The structure of claim 1, wherein:
the wafer comprises a handle wafer,
the semiconductor material is bulk Si,
the backside patterned metal layer is positioned between the handle wafer and the bulk Si,
the one or more devices comprise a plurality of active devices within a back end of the line (BEOL) layer,
the at least one contact is a plurality of through-silicon via (TSV) providing the electrical connection through the semiconductor material and the BEOL layer, and
a bottom surface of the BEOL layer is directly contacting a top surface of the semiconductor material.

9. The structure of claim 8, further comprising a marker layer which is different than the bulk Si, wherein:
the marker layer is on an underside of the bulk Si,
the backside patterned metal layer is on an underside of the marker layer, and
the at least one contact is a plurality of through silicon vias extending through the marker layer and in contact with the backside patterned metal layer along its length.

10. A structure, comprising:
a semiconductor material;
at least one device on a front side of the semiconductor material;
a backside patterned metal layer buried on a backside of the semiconductor material;
at least one contact connecting to a front side of the backside patterned metal layer, the at least one contact extending through the semiconductor material;
a wafer on a backside of the backside patterned metal layer; and
a logic circuit connecting to the backside patterned metal layer via the at least one contact, and which is configured to detect a resistance change in the backside patterned metal layer,
wherein the logic circuit is further configured to trigger a tamper signal in response to removal of at least one of the wafer and the backside patterned metal layer.

11. The structure of claim 10, further comprising an insulator material under the semiconductor material and the wafer on the backside patterned metal layer, wherein the backside patterned metal layer is separated from the at least one device and the semiconductor material by the insulator layer.

12. The structure of claim 11, wherein the backside patterned metal layer is buried between the wafer and the insulator material.

13. The structure of claim 12, wherein the at least one contact is a plurality of contacts along a length of the backside patterned metal layer.

14. The structure of claim 10, wherein the wafer is located underneath the semiconductor material, the semiconductor material is a bulk semiconductor material, and the backside patterned metal layer is buried between the wafer and the bulk semiconductor material.

15. The structure of claim 13, wherein the at least one contact is a plurality of through-silicon via (TSV).

16. The structure of claim 13, further comprising a silicon germanium (SiGe) material between the bulk semiconductor material and the backside patterned metal layer, the silicon germanium (SiGe) material directly contacting a top surface of the backside patterned metal layer and directly contacting a bottom surface of the semiconductor material, and the one or more devices comprise a plurality of active devices within a back end of the line (BEOL) layer, the at least one contact is a plurality of through-silicon via (TSV) providing the electrical connection through the semiconductor material and the BEOL layer, and a bottom surface of the BEOL layer is directly contacting a top surface of the semiconductor material.

17. The structure of claim 10, wherein the backside patterned metal layer prevents a scanning electron microscope (SEM) or transmission electron microscope (TEM) from reaching the at least one device.

18. The structure of claim 10, wherein the tamper signal alters a circuit operation in response to a detected resistance change of the backside patterned metal layer.

19. A method, comprising:
forming a silicon germanium (SiGe) material;
forming a semiconductor layer directly contacting a top surface of the SiGe material;
forming a back end of the line (BEOL) layer on the semiconductor layer;

forming a backside patterned metal layer which directly contacts a backside of the SiGe material; and forming a handle wafer on the backside patterned metal layer.

* * * * *